US009546321B2

(12) United States Patent
Barnes et al.

(10) Patent No.: US 9,546,321 B2
(45) Date of Patent: Jan. 17, 2017

(54) COMPOSITIONS AND METHODS FOR SELECTIVELY ETCHING TITANIUM NITRIDE

(71) Applicants: Jeffrey A. Barnes, Bethlehem, CT (US); Emanuel I. Cooper, Scarsdale, NY (US); Li-Min Chen, Norwalk, CT (US); Steven Lippy, Brookfield, CT (US); Rekha Rajaram, White Plains, NY (US); Sheng-Hung Tu, Danbury, CT (US)

(72) Inventors: Jeffrey A. Barnes, Bethlehem, CT (US); Emanuel I. Cooper, Scarsdale, NY (US); Li-Min Chen, Norwalk, CT (US); Steven Lippy, Brookfield, CT (US); Rekha Rajaram, White Plains, NY (US); Sheng-Hung Tu, Danbury, CT (US)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 0 days.

(21) Appl. No.: 14/368,714

(22) PCT Filed: Dec. 27, 2012

(86) PCT No.: PCT/US2012/071777
§ 371 (c)(1),
(2) Date: Jun. 25, 2014

(87) PCT Pub. No.: WO2013/101907
PCT Pub. Date: Jul. 4, 2013

(65) Prior Publication Data
US 2015/0027978 A1   Jan. 29, 2015

Related U.S. Application Data

(60) Provisional application No. 61/580,942, filed on Dec. 28, 2011, provisional application No. 61/675,640, filed on Jul. 25, 2012, provisional application No. 61/726,782, filed on Nov. 15, 2012.

(51) Int. Cl.
| | |
|---|---|
| *H01B 13/00* | (2006.01) |
| *C09K 13/10* | (2006.01) |
| *H01L 21/3213* | (2006.01) |
| *C09K 13/00* | (2006.01) |
| *C09K 13/06* | (2006.01) |
| *C09K 13/08* | (2006.01) |
| *C23F 1/02* | (2006.01) |
| *C23F 1/30* | (2006.01) |
| *C23F 1/40* | (2006.01) |
| *H01L 21/02* | (2006.01) |
| *H01L 21/311* | (2006.01) |

(52) U.S. Cl.
CPC ............... *C09K 13/10* (2013.01); *C09K 13/00* (2013.01); *C09K 13/06* (2013.01); *C09K 13/08* (2013.01); *C23F 1/02* (2013.01); *C23F 1/30* (2013.01); *C23F 1/40* (2013.01); *H01L 21/02063* (2013.01); *H01L 21/32134* (2013.01); *H01L 21/31144* (2013.01)

(58) Field of Classification Search
CPC .................... C09K 13/00; H01L 21/32134
See application file for complete search history.

(56) References Cited

U.S. PATENT DOCUMENTS

| | | | |
|---|---|---|---|
| 5,320,709 | A | 6/1994 | Bowden et al. |
| 5,417,877 | A | 5/1995 | Ward |
| 5,512,202 | A | 4/1996 | Borah |
| 5,571,447 | A | 11/1996 | Ward et al. |
| 5,672,577 | A | 9/1997 | Lee |
| 5,698,503 | A | 12/1997 | Ward et al. |
| 5,705,089 | A | 1/1998 | Sugihara et al. |
| 6,211,126 | B1 | 4/2001 | Wojtczak et al. |
| 6,224,785 | B1 | 5/2001 | Wojtczak et al. |
| 6,280,651 | B1 | 8/2001 | Wojtczak et al. |
| 6,326,130 | B1 | 12/2001 | Schwartzkopf et al. |
| 6,344,432 | B1 | 2/2002 | Wojtczak et al. |
| 6,492,310 | B2 | 12/2002 | Wojtczak et al. |
| 6,566,315 | B2 | 5/2003 | Wojtczak et al. |
| 6,599,370 | B2 | 7/2003 | Skee |
| 6,755,989 | B2 | 6/2004 | Wojtczak et al. |
| 6,773,873 | B2 | 8/2004 | Seijo et al. |
| 6,849,200 | B2 | 2/2005 | Baum et al. |
| 6,875,733 | B1 | 4/2005 | Wojtczak et al. |

(Continued)

FOREIGN PATENT DOCUMENTS

| | | |
|---|---|---|
| CN | 104730870 A | 6/2015 |
| EP | 2234145 A1 | 9/2010 |

(Continued)

OTHER PUBLICATIONS

International Search Report/Written Opinion, Apr. 26, 2013.

(Continued)

*Primary Examiner* — Roberts Culbert
(74) *Attorney, Agent, or Firm* — Tristan A. Fuierer; Moore & Van Allen, PLLC; Maggie Chappuis

(57) ABSTRACT

Compositions useful for the selective removal of titanium nitride and/or photoresist etch residue materials relative to metal conducting, e.g., tungsten, and insulating materials from a microelectronic device having same thereon. The removal compositions contain at least one oxidant and one etchant, may contain various corrosion inhibitors to ensure selectivity.

20 Claims, No Drawings

(56) References Cited

U.S. PATENT DOCUMENTS

| | | | |
|---|---|---|---|
| 6,896,826 B2 | 5/2005 | Wojtczak et al. | |
| 7,329,365 B2 | 2/2008 | Cho et al. | |
| 7,534,752 B2 | 5/2009 | Wojtczak et al. | |
| 7,922,824 B2 | 4/2011 | Minsek et al. | |
| 7,960,328 B2 | 6/2011 | Visintin et al. | |
| 7,985,297 B2 | 7/2011 | Park et al. | |
| 8,058,219 B2 | 11/2011 | Rath et al. | |
| 2002/0019128 A1 | 2/2002 | Lee et al. | |
| 2004/0149309 A1 | 8/2004 | Hsu | |
| 2004/0180300 A1 | 9/2004 | Minsek et al. | |
| 2004/0262569 A1* | 12/2004 | Cho | C09K 13/00 252/79.1 |
| 2005/0197265 A1 | 9/2005 | Rath et al. | |
| 2006/0063687 A1 | 3/2006 | Minsek et al. | |
| 2006/0148666 A1 | 7/2006 | Peters et al. | |
| 2006/0154186 A1 | 7/2006 | Minsek et al. | |
| 2006/0154839 A1 | 7/2006 | Ilardi et al. | |
| 2006/0199749 A1 | 9/2006 | Suzuki et al. | |
| 2006/0226122 A1 | 10/2006 | Wojtczak et al. | |
| 2007/0082497 A1 | 4/2007 | Lee et al. | |
| 2007/0087580 A1 | 4/2007 | Kang et al. | |
| 2007/0099810 A1* | 5/2007 | Matsunaga | C11D 3/0073 510/302 |
| 2007/0251551 A1 | 11/2007 | Korzenski et al. | |
| 2008/0076688 A1 | 3/2008 | Barnes et al. | |
| 2008/0125342 A1 | 5/2008 | Visintin et al. | |
| 2008/0242574 A1 | 10/2008 | Rath et al. | |
| 2009/0017636 A1 | 1/2009 | Kumazawa et al. | |
| 2009/0032766 A1 | 2/2009 | Rajaratnam et al. | |
| 2009/0082240 A1 | 3/2009 | Nukui et al. | |
| 2009/0120457 A1 | 5/2009 | Naghshineh et al. | |
| 2009/0212021 A1 | 8/2009 | Bernhard et al. | |
| 2009/0215658 A1* | 8/2009 | Minsek | C09G 1/02 510/175 |
| 2009/0281016 A1 | 11/2009 | Cooper et al. | |
| 2009/0301996 A1 | 12/2009 | Visintin et al. | |
| 2010/0065530 A1 | 3/2010 | Walker et al. | |
| 2010/0112728 A1 | 5/2010 | Korzenski et al. | |
| 2010/0163788 A1 | 7/2010 | Visintin et al. | |
| 2010/0176082 A1 | 7/2010 | Cooper et al. | |
| 2010/0190347 A1* | 7/2010 | RamachandraRao | H01L 21/02063 438/703 |
| 2010/0261632 A1 | 10/2010 | Korzenski et al. | |
| 2010/0286014 A1 | 11/2010 | Barnes | |
| 2011/0039747 A1 | 2/2011 | Zhou et al. | |
| 2011/0117751 A1 | 5/2011 | Sonthalia et al. | |
| 2011/0147341 A1 | 6/2011 | Sato et al. | |
| 2012/0015857 A1 | 1/2012 | Chen et al. | |
| 2012/0256122 A1* | 10/2012 | Sato | H01L 21/32134 252/79.2 |
| 2013/0045908 A1 | 2/2013 | Cui | |
| 2013/0123159 A1 | 5/2013 | Afzali-Ardakani et al. | |
| 2013/0203643 A1 | 8/2013 | Nakanishi et al. | |
| 2013/0280123 A1 | 10/2013 | Chen et al. | |
| 2014/0038420 A1 | 2/2014 | Chen et al. | |
| 2015/0175943 A1 | 6/2015 | Casteel, Jr. et al. | |

FOREIGN PATENT DOCUMENTS

| | | |
|---|---|---|
| EP | 2322692 A1 | 5/2011 |
| EP | 2592131 A2 | 5/2013 |
| JP | 2008285508 A | 11/2008 |
| JP | 2011159658 A | 8/2011 |
| JP | 2011205011 A | 10/2011 |
| JP | 2012036750 A | 2/2012 |
| JP | 2012251026 A | 12/2012 |
| KR | 1020060050581 A | 5/2006 |
| KR | 1020100007461 A | 1/2010 |
| TW | 201144484 A | 12/2011 |
| WO | 0306599 A1 | 1/2003 |
| WO | 2004094581 A1 | 11/2004 |
| WO | 2005017230 A1 | 2/2005 |
| WO | 2005057281 A2 | 6/2005 |
| WO | 2006110645 A2 | 10/2006 |
| WO | 2006113222 A2 | 10/2006 |
| WO | 2007027522 A2 | 3/2007 |
| WO | 2007044446 A1 | 4/2007 |
| WO | 2008157345 A2 | 12/2008 |
| WO | 2012048079 A1 | 5/2009 |
| WO | 2009073596 A2 | 6/2009 |
| WO | 2010017160 A2 | 2/2010 |
| WO | 2010086745 A1 | 8/2010 |
| WO | 2010091045 A2 | 8/2010 |
| WO | 2012097143 A2 | 7/2012 |
| WO | 2012174518 A2 | 12/2012 |
| WO | 2013138276 A1 | 9/2013 |
| WO | 2013138278 A1 | 9/2013 |

OTHER PUBLICATIONS

International Preliminary Report on Patentability, Jul. 10, 2014.
International Search Report/Written Opinion, Feb. 21, 2012.
Japanese Office Action, Feb. 15, 2012.
Chinese Office Action, Feb. 24, 2016.
Supplementary European Search Report, Jul. 13, 2015.

* cited by examiner

COMPOSITIONS AND METHODS FOR SELECTIVELY ETCHING TITANIUM NITRIDE

CROSS-REFERENCE TO RELATED APPLICATIONS

This application is filed under the provisions of 35 U.S.C. §371 and claims the priority of International Patent Application No. PCT/US2012/071777 filed on Dec. 27, 2012 entitled "COMPOSITIONS AND METHODS FOR SELECTIVELY ETCHING TITANIUM NITRIDE" in the name of Jeffrey A. Barnes, et al., which claims priority to U.S. Provisional Patent Application No. 61/726,782 filed on Nov. 15, 2012, U.S. Provisional Patent Application No. 61/675,640 filed on Jul. 25, 2012 and U.S. Provisional Patent Application No. 61/580,942 filed on Dec. 28, 2011, all of which are hereby incorporated by reference herein in their entirety.

FIELD

The present invention relates to a composition and process for selectively etching titanium nitride and/or photoresist etch residues in the presence of metal conductor and insulator materials (i.e., low-k dielectrics), and more particularly to a composition and process for effectively and efficiently etching titanium nitride and/or photoresist etch residues at an etch rate and selectivity that is higher than that of exposed or underlying layers of copper, tungsten, and low-k dielectric materials.

DESCRIPTION OF THE RELATED ART

Photoresist masks are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying metal conductor layer and low-k dielectric material. In other words, the removal chemistry is required to be highly selective to the metal conductor layer and low-k dielectric layer.

Accordingly, an object of the present invention to provide improved compositions for the selective removal of hard mask materials relative to metal conductor layers and low-k dielectric layers that are present, while not compromising the etch rate of the hard mask.

SUMMARY OF THE INVENTION

The present invention relates to a composition and process for selectively etching hard mask layers and/or photoresist etch residues relative to metal conductor layers and low-k dielectric layers that are present. More specifically, the present invention relates to a composition and process for selectively etching titanium nitride and/or photoresist etch residues relative to copper, tungsten, and low-k dielectric layers.

In one aspect, a composition for selectively removing titanium nitride and/or photoresist etch residue material from the surface of a microelectronic device having same thereon is described, said composition comprising at least one oxidizing agent, at least one etchant, and at least one solvent, wherein the composition is substantially devoid of hydrogen peroxide.

In another aspect, a composition for selectively removing titanium nitride and/or photoresist etch residue material from the surface of a microelectronic device having same thereon is described, said composition comprising at least one oxidizing agent, at least one etchant, at least one metal corrosion inhibitor, and at least one solvent.

In yet another aspect, a method of etching titanium nitride material from a surface of a microelectronic device having same thereon, said method comprising contacting the surface with a composition comprising at least one oxidizing agent, at least one etchant, and at least one solvent, wherein the composition is substantially devoid of hydrogen peroxide, wherein the composition selectively removes the titanium nitride material from the surface relative to metals and insulating materials.

In still another aspect, a method of etching titanium nitride material from a surface of a microelectronic device having same thereon, said method comprising contacting the surface with a composition comprising at least one oxidizing agent, at least one etchant, at least one metal corrosion inhibitor, and at least one solvent, wherein the composition selectively removes the titanium nitride material from the surface relative to metals and insulating materials.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions and processes for selectively etching hard mask layers and/or photoresist etch residues relative to metal conductor layers and low-k dielectric layers that are present. More specifically, the present invention relates to a composition and process for selectively etching titanium nitride and/or photoresist etch residues relative to copper, tungsten, and low-k dielectric layers. Other materials that may be present on the microelectronic device, should not be substantially removed or corroded by said compositions.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Hardmask capping layer" as used herein corresponds to materials deposited over dielectric material to protect same during the plasma etch step. Hardmask capping layers are traditionally silicon nitrides, silicon oxynitrides, titanium nitride, titanium oxynitride, titanium and other similar compounds.

As used herein, "titanium nitride" and "$TiN_x$" correspond to pure titanium nitride as well as impure titanium nitride including varying stoichiometries, and oxygen content ($Ti-O_xN_y$)

As used herein, "about" is intended to correspond to ±5% of the stated value.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "metal conductor layers" comprise copper, tungsten, cobalt, molybdenum, aluminum, ruthenium, alloys comprising same, and combinations thereof.

As defined herein, "amine" species include at least one primary, secondary, and tertiary amines, with the proviso that (i) species including both a carboxylic acid group and an amine group, (ii) surfactants that include amine groups, and (iii) species where the amine group is a substituent (e.g., attached to an aryl or heterocyclic moiety) are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen.

As defined herein, "photoresist etch residues" corresponds to any residue comprising photoresist material, or material that is a by-product of photoresist subsequent to an etching or ashing step, as readily understood by the person skilled in the art.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "fluoride" species correspond to species including an ionic fluoride ($F^-$) or covalently bonded fluorine. It is to be appreciated that the fluoride species may be included as a fluoride species or generated in situ.

As used herein, "chloride" species correspond to species including an ionic chloride ($Cl^-$), with the proviso that surfactants that include chloride anions are not considered "chlorides" according to this definition.

As defined herein, a strong base is any base having at least one pKa greater than 11, while a weak base is any base having at least one pKa less than 11.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Embodiments of the present invention include a chemistry for removing hard mask and/or photoresist etch residues. In one embodiment, the removal composition is a wet-etch solution that removes a metal hard mask and/or photoresist etch residues on a dielectric layer and is highly selective to a metal conductor layer underneath the dielectric layer and the dielectric layer itself. In a more specific embodiment, the removal composition is a wet-etch solution that removes a titanium nitride layer and/or photoresist etch residues that is highly selective to at least one of copper, tungsten, and low-k dielectric materials.

Accordingly, in one aspect, a composition for selectively removing titanium nitride and/or photoresist etch residue material from the surface of a microelectronic device having same thereon is described, said composition including at least one oxidizing agent and at least one etchant, wherein the composition is substantially devoid of hydrogen peroxide. In one embodiment, the composition for removing titanium nitride and/or photoresist etch residue material from the surface of a microelectronic device having same thereon comprises, consists of, or consists essentially of at least one oxidizing agent, at least one etchant, and at least one solvent, wherein the composition is substantially devoid of hydrogen peroxide. In another embodiment, the composition for removing titanium nitride and/or photoresist etch residue material from the surface of a microelectronic device having same thereon comprises, consists of, or consists essentially of at least one oxidizing agent, at least one etchant, at least one corrosion inhibitor, and at least one solvent, wherein the composition is substantially devoid of hydrogen peroxide. In still another embodiment, the composition for removing titanium nitride and/or photoresist etch residue material from the surface of a microelectronic device having same thereon comprises, consists of, or consists essentially of at least one oxidizing agent, at least one etchant, at least one corrosion inhibitor, at least surfactant, and at least one solvent, wherein the composition is substantially devoid of hydrogen peroxide. In yet another embodiment, the composition for removing titanium nitride and/or photoresist etch residue material from the surface of a microelectronic device having same thereon comprises, consists of, or consists essentially of at least one oxidizing agent, at least one etchant, at least one corrosion inhibitor, at least passivating agent, and at least one solvent, wherein the composition is substantially devoid of hydrogen peroxide. In a further embodiment, the composition for removing titanium nitride and/or photoresist etch residue material from the surface of a microelectronic device having same thereon comprises, consists of, or consists essentially of at least one oxidizing agent, at least one etchant, at least one corrosion inhibitor, at least one solvent, and at least one iodine scavenger, wherein the composition is substantially devoid of hydrogen peroxide. In each embodiment of the first aspect, at least one silicon-containing compound can be added. Preferably, these compositions comprise at least 95 wt % water, more preferably at least 97 wt % water, and most preferably at least 98 wt % water, based on the total weight of the composition. Advantageously, these compositions have a TiN to tungsten selectivity of greater than 50:1 and a tungsten removal rate less than 1 Å min$^{-1}$, even more preferably greater than 60:1, and a tungsten removal rate less than 0.5 Å min$^{-1}$ These compositions are substantially devoid of amines, as defined herein, abrasive materials, chloride sources, metal halides, and combinations thereof. These compositions have pH value in a range from 0 to 4, preferably 1 to 3.

In a second aspect, a composition for selectively removing titanium nitride and/or photoresist etch residue material from the surface of a microelectronic device having same thereon is described, said composition including at least one oxidizing agent and at least one etchant. In one embodiment, the composition for removing titanium nitride and/or photoresist etch residue material from the surface of a microelectronic device having same thereon comprises, consists of, or consists essentially of at least one oxidizing agent, at least one etchant, at least one metal corrosion inhibitor, and at least one solvent. In another embodiment, the composition for removing titanium nitride and/or photoresist etch residue material from the surface of a microelectronic device having same thereon comprises, consists of, or consists essentially of at least one oxidizing agent, at least one etchant, at least one carboxylate salt, at least one metal corrosion inhibitor, and at least one solvent. In still another embodiment, the composition for removing titanium nitride and/or photoresist etch residue material from the surface of a microelectronic device having same thereon comprises, consists of, or consists essentially of at least one oxidizing agent, at least one etchant, at least one carboxylate salt, at least one metal corrosion inhibitor, at least one oxidizing agent stabilizer, and at least one solvent. In yet another embodiment, the composition for removing titanium nitride and/or photoresist etch residue material from the surface of a microelectronic device having same thereon comprises, consists of, or consists essentially of at least one oxidizing agent, at least one etchant, at least one carboxylate salt, at least one metal corrosion inhibitor, at least one oxidizing agent stabilizer, at least one surfactant, and at least one solvent. In another embodiment, the composition for removing titanium nitride and/or photoresist etch residue material from the surface of a microelectronic device having same thereon comprises, consists of, or consists essentially of at least one oxidizing agent, at least one etchant, at least one metal corrosion inhibitor, at least one oxidizing agent stabilizer, at least one surfactant, and at least one solvent. In yet another embodiment, the composition for removing titanium nitride and/or photoresist etch residue material from the surface of a microelectronic device having same thereon comprises, consists of, or consists essentially of at least one oxidizing agent, at least one etchant, at least one metal corrosion inhibitor, at least one oxidizing agent stabilizer, and at least one solvent. In each embodiment of the second aspect, at least one silicon-containing compound can be added. These compositions are substantially devoid of silicates, abrasive materials, chloride sources, metal halides, and combinations thereof. These compositions have pH value in a range from about 5 to about 10, preferably about 6 to about 9.

Etchants are added to increase the etch rate of the titanium nitride. Etchants contemplated include, but are not limited to, HF, ammonium fluoride, tetrafluoroboric acid, hexafluorosilicic acid, other compounds containing B—F or Si—F bonds, tetrabutylammonium tetrafluoroborate (TBA-BF$_4$), tetraalkylammonium fluoride (NR$_1$R$_2$R$_3$R$_4$F), strong bases such as tetraalkylammonium hydroxide (NR$_1$R$_2$R$_3$R$_4$OH), where R$_1$, R$_2$, R$_3$, R$_4$ may be the same as or different from one another and is selected from the group consisting of hydrogen, straight-chained or branched C$_1$-C$_6$ alkyl groups (e.g., methyl, ethyl, propyl, butyl, pentyl, hexyl), C$_1$-C$_6$ alkoxy groups (e.g., hydroxyethyl, hydroxypropyl) substituted or unsubstituted aryl groups (e.g., benzyl), weak bases, and combinations thereof. Preferably, the fluoride source comprises tetrafluoroboric acid, hexafluorosilicic acid, H$_2$ZrF$_6$, H$_2$TiF$_6$, HPF$_6$, ammonium fluoride, tetramethylammonium fluoride, tetramethylammonium hydroxide, ammonium hexafluorosilicate, ammonium hexafluorotitanate, or a combination of ammonium fluoride and tetramethylammonium fluoride. Alternatively, or in addition to fluoride sources, the etchant can comprise a strong base such as tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide (DEDMAH), 1,1,3,3-tetramethylguanidine (TMG), guanidine carbonate, arginine, and combinations thereof. Weak bases contemplated include, but are not limited to, ammonium hydroxide, monoethanolamine (MEA), diethanolamine (DEA), triethanolamine (TEA), ethylenediamine, cysteine, and combinations thereof. Most preferably, the etchant comprises hexafluorosilicic acid.

Oxidizing agents are included to oxidize Ti$^{3+}$ in TiN$_x$. Oxidizing agents contemplated herein include, but are not limited to, hydrogen peroxide (H$_2$O$_2$), FeCl$_3$, FeF$_3$, Fe(NO$_3$)$_3$, Sr(NO$_3$)$_2$, CoF$_3$, MnF$_3$, oxone (2 KHSO$_5$·KHSO$_4$·K$_2$SO$_4$), periodic acid, iodic acid, vanadium (V) oxide, vanadium (IV,V) oxide, ammonium vanadate, ammonium polyatomic salts (e.g., ammonium peroxomonosulfate, ammonium chlorite (NH$_4$ClO$_2$), ammonium chlorate (NH$_4$ClO$_3$), ammonium iodate (NH$_4$IO$_3$), ammonium nitrate (NH$_4$NO$_3$), ammonium perborate (NH$_4$BO$_3$), ammonium perchlorate (NH$_4$ClO$_4$), ammonium periodate (NH$_4$IO$_4$), ammonium persulfate ((NH$_4$)$_2$S$_2$O$_8$), ammonium hypochlorite (NH$_4$ClO)), ammonium tungstate ((NH$_4$)$_{10}$H$_2$(W$_2$O$_7$)), sodium polyatomic salts (e.g., sodium persulfate (Na$_2$S$_2$O$_8$), sodium hypochlorite (NaClO), sodium perborate), potassium polyatomic salts (e.g., potassium iodate (KIO$_3$), potassium permanganate (KMnO$_4$), potassium persulfate, nitric acid (HNO$_3$), potassium persulfate (K$_2$S$_2$O$_8$), potassium hypochlorite (KClO)), tetramethylammonium polyatomic salts (e.g., tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$)IO$_4$), tetramethylammonium persulfate ((N(CH$_3$)$_4$)S$_2$O$_8$)), tetrabutylammonium polyatomic salts (e.g., tetrabutylammonium peroxomonosulfate), peroxomonosulfuric acid, ferric nitrate (Fe(NO$_3$)$_3$), urea hydrogen peroxide ((CO(NH$_2$)$_2$)H$_2$O$_2$), peracetic acid (CH$_3$(CO)OOH), 1,4-benzoquinone, toluquinone, dimethyl-1,4-benzoquinone, chloranil, alloxan, N-methylmorpholine N-oxide, trimethylamine N-oxide, and combinations thereof. When the oxidizing agent is a salt it can be hydrated or anhydrous. The oxidizing agent may be introduced to the composition at the manufacturer, prior to introduction of the composition to the device wafer, or alternatively at the device wafer, i.e., in situ. Preferably, the oxidizing agent for the composition of the second aspect comprises hydrogen peroxide. Preferably, the oxidizing agent for the composition of the first aspect comprises vanadium oxide, ammonium iodate, ammonium periodate, iodic acid, or periodic acid.

When the oxidizing agent comprises iodate or periodate, an iodine scavenger is preferably added to the removal composition. Although not wishing to be bound by theory, it is thought that as the iodate or periodate are reduced, iodine accumulates, which increases the rate of copper etch. Iodine scavengers include, but are not limited to, ketones more preferably ketones with hydrogen(s) alpha to the carbonyl such as 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, and combinations thereof. Preferably, the iodine scavenger includes 4-methyl-2-pentanone, 2,4-dimethyl-3-pentanone, or cyclohexanone.

Carboxylate salts are added to increase the etch rate of the $TiN_x$ and are largely oxidation resistant. Although not wishing to be bound by theory, it is thought that the carboxylate salts undergo an in situ reaction to produce percarboxylates, which are very strong oxidants. Preferably, the carboxylate salts comprise an ammonium cation or a tetraalkylammonium cation ($[NR^1R^2R^3R^4]^+$, where $R^1$, $R^2$, $R^3$ and $R^4$ may be the same as or different from one another and are selected from the group consisting of hydrogen and $C_1$-$C_6$ alkyl (e.g., methyl, ethyl, propyl, butyl, pentyl, hexyl)), and an anion selected from the group consisting of acetate, benzoate, propionate, citrate, formate, oxalate, tartarate, succinate, lactate, maleate, malonate, fumarate, malate, ascorbate, mandelate, and phthalate. Most preferably, the carboxylate salts comprise ammonium acetate, ammonium benzoate, or a combination thereof.

Metal corrosion inhibitors are added to block the oxidative activity of the oxidizing agent(s) and the carboxylate salt(s) (when present). Metal corrosion inhibitors contemplated herein include, but are not limited to, 5-amino-1,3,4-thiadiazole-2-thiol (ATDT), benzotriazole (BTA), 1,2,4-triazole (TAZ), tolyltriazole, 5-methyl-benzotriazole, 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-aminopentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, pentylenetetrazole, 5-phenyl-1H-tetrazole, 5-benzyl-1H-tetrazole, Ablumine O (Taiwan Surfactant), 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, benzothiazole, imidazole, indiazole, adenosine, carbazole, saccharin, and benzoin oxime. Additional corrosion inhibitors include cationic quaternary salts such as benzalkonium chloride, benzyldimethyldodecylammonium chloride, myristyltrimethylammonium bromide, dodecyltrimethylammonium bromide, hexadecylpyridinium chloride, Aliquat 336 (Cognis), benzyldimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, and hexamethonium chloride. Other corrosion inhibitors include non-ionic surfactants such as PolyFox PF-159 (OMNOVA Solutions), poly(ethylene glycol) ("PEG"), poly(propylene glycol) ("PPG"), PEG-PPG copolymers such as Pluronic F-127 (BASF), anionic surfactants such as dodecylbenzenesulfonic acid, sodium dodecylbenzenesulfonate, and combinations thereof. The quaternary salts can function as both corrosion inhibitors (especially for copper and tungsten) and wetting agents. It will be obvious to those skilled in the art that, while quaternary salts are available commercially most often as chlorides or bromides, it is easy to ion-exchange the halide anion with non-halide anions such as sulfate, methanesulfonate, nitrate, hydroxide, etc. Such converted quaternary salts are also contemplated herein. In a particularly preferred embodiment, 5-methyl-1H-benzotriazole is known to block the oxidative activity of the oxidizing agents against copper. Other preferred corrosion inhibitors include the cationic quaternary salts, more preferably myristyltrimethylammonium bromide, benzalkonium chloride, hexadecyltrimethylammonium p-toluenesulfonate, and hexadecyltrimethylammonium hydroxide, and tetrazoles such as 5-benzyl-1H-tetrazole.

Compositions of the first or second aspect can further include at least one low-k passivating agent to reduce the chemical attack of the low-k dielectric layers and to protect the wafer from additional oxidation. Preferred low-k passivating agent include, but are not limited to, boric acid, borate salts, such as ammonium pentaborate, sodium tetraborate, 3-hydroxy-2-naphthoic acid, malonic acid, iminodiacetic acid. When present, the composition includes about 0.01 wt % to about 2 wt % low-k passivating agent, based on the total weight of the composition. Preferably, less than 2 wt.

% of the underlying low-k material is etched/removed using the compositions described herein, more preferably less than 1 wt. %, most preferably less than 0.5 wt. %, based on the total weight of the underlying low-k material.

Compositions of the first or second aspect can further include at least one silicon-containing compound to reduce the activity of the etchant source. In one embodiment, the at least one silicon-containing compounds comprises an alkoxysilane. Alkoxysilanes contemplated have the general formula $SiR^1R^2R^3R^4$, wherein the $R^1$, $R^2$, $R^3$ and $R^4$ are the same as or different from one another and are selected from the group consisting of straight-chained $C_1$-$C_6$ alkyl groups (e.g., methyl, ethyl, propyl, butyl, pentyl, hexyl), branched $C_1$-$C_6$ alkyl groups, $C_1$-$C_6$ alkoxy groups (e.g, methoxy, ethoxy, propoxy, butoxy, pentoxy, hexoxy), a phenyl group, and a combination thereof. It should be appreciated by the skilled artisan, that to be characterized as an alkoxysilane, at least one of $R^1$, $R^2$, $R^3$ or $R^4$ must be a $C_1$-$C_6$ alkoxy group. Alkoxysilanes contemplated include methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, and combinations thereof. Other silicon-containing compounds that can be used instead or in addition to the alkoxysilanes include ammonium hexafluorosilicate, sodium silicate, tetramethyl ammonium silicate (TMAS), and combinations thereof. Preferably, the silicon-containing compound comprises TEOS, TMAS, and sodium silicate. When present, the amount of silicon-containing compound(s) is in the range from about 0.001 wt % to about 2 wt %, based on the total weight of the composition.

Oxidizing agent stabilizers can be added to the aqueous composition, especially when the oxidizing agent is combined with the other components at any time prior to the point of use. Oxidizing agent stabilizers include, but are not limited to, glycine, serine, proline, leucine, alanine, asparagine, aspartic acid, glutamine, valine, and lysine, nitrilotriacetic acid, iminodiacetic acid, etidronic acid, ethylenediaminetetraacetic acid (EDTA), (1,2-cyclohexylenedinitrilo) tetraacetic acid (CDTA), uric acid, tetraglyme, diethylenetriamine pentaacetic acid, propylenediamine tetraacetic acid, ethylenediamine disuccinic acid, sulfanilamide, and combinations thereof. Preferably, the oxidizing agent stabilizer comprises CDTA, sulfanilamide, or a combination thereof.

To ensure wetting, especially when the pH is low, a surfactant can be added to the aqueous composition, preferably an oxidation resistant, fluorinated anionic surfactant. Anionic surfactants contemplated in the compositions of the present invention include, but are not limited to, fluorosurfactants such as ZONYL® UR and ZONYL® FS-62 (DuPont Canada Inc., Mississauga, Ontario, Canada), and ammonium fluoroalkylsulfonates such as Novec™ 4300 (3M). When the etchant used comprises a fluoride, it is contemplated to use a long-chain tetraalkylammonium fluoride that can be used as a surfactant and the etchant.

The at least one solvent can comprise water, at least one water-miscible organic solvent, or a combination thereof, wherein the at least one water-miscible organic solvent is selected from the group consisting of a compound of formula $R^1R^2R^3C(OH)$, where $R^1$, $R^2$ and $R^3$ are independent from each other and are selected from to the group consisting of hydrogen, $C_2$-$C_{30}$alkyls, $C_2$-$C_{30}$alkenes, cycloalkyls, $C_2$-$C_{30}$alkoxys, and combinations thereof. For example, the at least one solvent can comprise at least one species selected from the group consisting of water, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, and combinations thereof. Preferably, the at least one solvent comprises water, most preferably deionized water.

In another embodiment, any of the compositions of the invention may further comprise titanium nitride and/or photoresist etch material residue, wherein the residue is suspended and/or dissolved in the aqueous composition.

In one embodiment, the composition of the first aspect comprises, consists of, or consists essentially of at least one oxidizing agent, at least one etchant, and at least one solvent, wherein the composition is substantially devoid of hydrogen peroxide, present in the following ranges, based on the total weight of the composition:

| component | % by weight | more preferred % by weight | most preferred % by weight |
|---|---|---|---|
| oxidizing agent(s) | about 0.001 wt % to about 2 wt % | about 0.001 wt % to about 1 wt % | about 0.001 wt % to about 0.2 wt % |
| etchant(s) | about 0.01 wt % to about 10 wt % | about 0.01 wt % to about 5 wt % | about 0.1 wt % to about 2 wt % |
| water | about 88 wt % to about 99.99 wt % | about 94 wt % to about 99.99 wt % | about 99 wt % to about 99.9 wt % |

Preferably, the oxidizing agent comprises vanadium oxide, ammonium iodate, periodic acid, or 1,4-benzoquinone. Preferably, the etchant comprises tetrafluoroboric acid or hexafluorosilicic acid. When the oxidizing agent comprises an iodate or periodate compound, the removal composition of the first aspect preferably further includes at least one iodine scavenger.

In another embodiment, the composition of the first aspect comprises, consists of, or consists essentially of at least one oxidizing agent, at least one etchant, at least one solvent, and at least one corrosion inhibitor, wherein the composition is substantially devoid of hydrogen peroxide, present in the following ranges, based on the total weight of the composition:

| component | % by weight | more preferred % by weight | most preferred % by weight |
|---|---|---|---|
| oxidizing agent(s) | about 0.001 wt % to about 2 wt % | about 0.001 wt % to about 1 wt % | about 0.001 wt % to about 0.2 wt % |

-continued

| component | % by weight | more preferred % by weight | most preferred % by weight |
| --- | --- | --- | --- |
| etchant(s) | about 0.01 wt % to about 10 wt % | about 0.01 wt % to about 5 wt % | about 0.1 wt % to about 2 wt % |
| corrosion inhibitor(s) | about 0.001 wt % to about 2 wt % | about 0.001 wt % to about 1 wt % | about 0.0001 wt % to about 1 wt % |
| water | about 86 wt % to about 99.99 wt % | about 93 wt % to about 99.99 wt % | about 98.5 wt % to about 99.9 wt % |

Preferably, the oxidizing agent comprises vanadium oxide, ammonium iodate, periodic acid, or 1,4-benzoquinone. Preferably, the etchant comprises tetrafluoroboric acid or hexafluorosilicic acid. When the oxidizing agent comprises an iodate or periodate compound, the removal composition of the first aspect preferably further includes at least one iodine scavenger.

In another embodiment, the composition of the first aspect comprises, consists of, or consists essentially of at least one oxidizing agent, at least one etchant, at least one solvent, at least one corrosion inhibitor, and at least one surfactant, wherein the composition is substantially devoid of hydrogen peroxide, present in the following ranges, based on the total weight of the composition:

| component | % by weight | more preferred % by weight | most preferred % by weight |
| --- | --- | --- | --- |
| oxidizing agent(s) | about 0.001 wt % to about 2 wt % | about 0.001 wt % to about 1 wt % | about 0.001 wt % to about 0.2 wt % |
| etchant(s) | about 0.01 wt % to about 10 wt % | about 0.01 wt % to about 5 wt % | about 0.1 wt % to about 2 wt % |
| corrosion inhibitor(s) | about 0.001 wt % to about 2 wt % | about 0.001 wt % to about 1 wt % | about 0.0001 wt % to about 1 wt % |
| surfactant(s) | about 0.001 wt % to about 2 wt % | about 0.001 wt % to about 1 wt % | about 0.001 wt % to about 0.2 wt % |
| water | about 84 wt % to about 99.99 wt % | about 92 wt % to about 99.99 wt % | about 98.5 wt % to about 99.9 wt % |

Preferably, the oxidizing agent comprises vanadium oxide, ammonium iodate, periodic acid, or 1,4-benzoquinone. Preferably, the etchant comprises tetrafluoroboric acid or hexafluorosilicic acid. When the oxidizing agent comprises an iodate or periodate compound, the removal composition of the first aspect preferably further includes at least one iodine scavenger.

In still another embodiment, the composition of the first aspect comprises, consists of, or consists essentially of at least one oxidizing agent, at least one etchant, at least one solvent, at least one corrosion inhibitor, and at least one passivating agent, wherein the composition is substantially devoid of hydrogen peroxide, present in the following ranges, based on the total weight of the composition:

| component | % by weight | more preferred % by weight | most preferred % by weight |
| --- | --- | --- | --- |
| oxidizing agent(s) | about 0.001 wt % to about 2 wt % | about 0.001 wt % to about 1 wt % | about 0.001 wt % to about 0.2 wt % |
| etchant(s) | about 0.01 wt % to about 10 wt % | about 0.01 wt % to about 5 wt % | about 0.1 wt % to about 2 wt % |
| corrosion inhibitor(s) | about 0.001 wt % to about 2 wt % | about 0.001 wt % to about 1 wt % | about 0.0001 wt % to about 1 wt % |
| passivating agent(s) | about 0.001 wt % to about 2 wt % | about 0.001 wt % to about 1 wt % | about 0.001 wt % to about 0.2 wt % |
| water | about 84 wt % to about 99.99 wt % | about 92 wt % to about 99.99 wt % | about 98.5 wt % to about 99.9 wt % |

Preferably, the oxidizing agent comprises vanadium oxide, ammonium iodate, periodic acid, or 1,4-benzoquinone. Preferably, the etchant comprises tetrafluoroboric acid or hexafluorosilicic acid. When the oxidizing agent comprises an iodate or periodate compound, the removal composition of the first aspect preferably further includes at least one iodine scavenger.

In another embodiment, the composition of the first aspect comprises, consists of, or consists essentially of at least one oxidizing agent, at least one etchant, at least one solvent, at least one corrosion inhibitor, at least one silicon-containing compound, and at least one passivating agent, wherein the composition is substantially devoid of hydrogen peroxide, present in the following ranges, based on the total weight of the composition:

| component | % by weight | more preferred % by weight | most preferred % by weight |
| --- | --- | --- | --- |
| oxidizing agent(s) | about 0.001 wt % to about 2 wt % | about 0.001 wt % to about 1 wt % | about 0.001 wt % to about 0.2 wt % |
| etchant(s) | about 0.01 wt % to about 10 wt % | about 0.01 wt % to about 5 wt % | about 0.1 wt % to about 2 wt % |
| corrosion inhibitor(s) | about 0.001 wt % to about 2 wt % | about 0.001 wt % to about 1 wt % | about 0.0001 wt % to about 1 wt % |
| passivating agent(s) | about 0.001 wt % to about 2 wt % | about 0.001 wt % to about 1 wt % | about 0.001 wt % to about 0.2 wt % |
| silicon-containing compound(s) | about 0.001 wt % to about 1 wt % | about 0.01 wt % to about 0.5 wt % | about 0.01 wt % to about 0.5 wt % |
| water | about 84 wt % to about 99.99 wt % | about 92 wt % to about 99.99 wt % | about 98.5 wt % to about 99.9 wt % |

Preferably, the oxidizing agent comprises vanadium oxide, ammonium iodate, periodic acid, or 1,4-benzoquinone. Preferably, the etchant comprises tetrafluoroboric acid or hexafluorosilicic acid. When the oxidizing agent comprises an iodate or periodate compound, the removal composition of the first aspect preferably further includes at least one iodine scavenger.

Most preferably, the removal composition of the first aspect comprises, consists of, or consists essentially of at least one iodate or periodate oxidizing agent, at least one etchant, at least one solvent, at least one corrosion inhibitor, at least one passivating agent, at least one silicon-containing compound, and at least one iodine scavenger, wherein the composition is substantially devoid of hydrogen peroxide. Even more preferably, the removal composition of the first aspect comprises, consists of, or consists essentially of at least one iodate or periodate oxidizing agent, hexafluorosilicic acid, water, at least one corrosion inhibitor, at least one passivating agent, at least one silicon-containing compound, and at least one iodine scavenger, wherein the composition is substantially devoid of hydrogen peroxide. Most preferably, the removal composition of the first aspect comprises, consists of, or consists essentially of ammonium iodate, hexafluorosilicic acid, water, TEOS, at least one corrosion inhibitor, at least one passivating agent, and at least one iodine scavenger selected from the group consisting of 4-methyl-2-pentanone, 2,4-dimethyl-3-pentanone, cyclohexanone, and 5-methyl-3-heptanone, wherein the composition is substantially devoid of hydrogen peroxide. In another alternative, the removal composition of the first aspect comprises, consists of, or consists essentially of at least one iodate or periodate oxidizing agent, at least one etchant, at least one solvent, at least one corrosion inhibitor, and at least one silicon-containing compound, wherein the composition is substantially devoid of hydrogen peroxide. Even more preferably, the removal composition of the first aspect comprises, consists of, or consists essentially of at least one iodate or periodate oxidizing agent, hexafluorosilicic acid, water, at least one corrosion inhibitor, and at least one silicon-containing compound, wherein the composition is substantially devoid of hydrogen peroxide. Most preferably, the removal composition of the first aspect comprises, consists of, or consists essentially of ammonium iodate, hexafluorosilicic acid, water, TEOS, and at least one corrosion inhibitor, wherein the composition is substantially devoid of hydrogen peroxide.

In an embodiment of the composition of the second aspect, the composition comprises, consists of, or consists essentially of at least one oxidizing agent, at least one etchant, at least one metal corrosion inhibitor, at least one oxidizing agent stabilizer, and at least one solvent, present in the following ranges, based on the total weight of the composition:

| component | % by weight | more preferred % by weight | most preferred % by weight |
|---|---|---|---|
| oxidizing agent(s) | about 0.001 wt % to about 50 wt % | about 1 wt % to about 30 wt % | about 10 wt % to about 30 wt % |
| etchant(s) | about 0.01 wt % to about 10 wt % | about 0.1 wt % to about 5 wt % | about 0.2 wt % to about 4 wt % |
| metal corrosion inhibitor(s) | about 0.01 to about 1 wt % | about 0.02 to about 1 wt % | about 0.02 to about 0.5 wt % |
| oxidizing agent stabilizer(s) | about 0.0001 to about 0.5 wt % | about 0.0005 to about 0.2 wt % | about 0.001 to about 0.1 wt % |
| water | about 39 wt % to about 99 wt % | about 64 wt % to about 99 wt % | about 66 wt % to about 90 wt % |

Preferably, the oxidizing agent comprises hydrogen peroxide and the etchant comprises TMAH.

In still another embodiment of the composition of the second aspect, the composition comprises, consists of, or consists essentially of at least one oxidizing agent, at least one etchant, at least one metal corrosion inhibitor, at least one oxidizing agent stabilizer, at least one carboxylate salt, at least one surfactant, and at least one solvent, present in the following ranges, based on the total weight of the composition:

| component | % by weight | more preferred % by weight | most preferred % by weight |
|---|---|---|---|
| oxidizing agent(s) | about 0.001 wt % to about 50 wt % | about 1 wt % to about 30 wt % | about 10 wt % to about 30 wt % |
| etchant(s) | about 0.01 wt % to about 10 wt % | about 0.1 wt % to about 5 wt % | about 0.2 wt % to about 4 wt % |
| metal corrosion inhibitor(s) | about 0.01 to about 1 wt % | about 0.02 to about 1 wt % | about 0.02 to about 0.5 wt % |
| oxidizing agent stabilizer(s) | about 0.0001 to about 0.5 wt % | about 0.0005 to about 0.2 wt % | about 0.001 to about 0.1 wt % |
| surfactant(s) | about 0.0001 to about 0.5 wt % | about 0.0005 to about 0.2 wt % | about 0.001 to about 0.1 wt % |
| carboxylate salt(s) | about 1 wt % to about 50 wt % | about 2 wt % to about 25 wt % | about 5 wt % to about 15 wt % |
| solvent(s) | about 1 wt % to about 99 wt % | about 39 wt % to about 97 wt % | about 51 wt % to about 85 wt % |

Preferably, the oxidizing agent comprises hydrogen peroxide, the etchant comprises TMAH, and the carboxylate salt comprises ammonium acetate.

It will be appreciated that it is common practice to make concentrated forms of the compositions to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted composition by the manufacturer before use and/or during use at the fab.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, a third aspect relates to a kit including, in one or more containers, one or more components adapted to form the compositions described herein. The containers of the kit must be suitable for storing and shipping said removal composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

In a fourth aspect, the invention relates to methods of etching titanium nitride material from the surface of the microelectronic device having same thereon using the composition of the first aspect or the composition of the second aspect, as described herein. For example, titanium nitride material may be removed without substantially damaging/removing metal conductor and insulator materials that are present on the microelectronic device. Accordingly, in a preferred embodiment, a method of selectively and substantially removing titanium nitride and/or photoresist etch residue materials relative to metal conductor and insulator materials from the surface of the microelectronic device having same thereon is described using the composition of the first aspect or the composition of the second aspect, as described herein. In another preferred embodiment, a method of selectively and substantially removing titanium nitride and/or photoresist etch residue materials relative to metal conductor (e.g., copper), tungsten and insulator materials from the surface of the microelectronic device having same thereon is described using the composition of the first aspect described herein.

In etching applications, the composition is applied in any suitable manner to the surface of the microelectronic device having the titanium nitride and/or photoresist etch residue material thereon, e.g., by spraying the composition on the surface of the device, by dipping (in a static or dynamic volume of the composition) of the device including the titanium nitride and/or photoresist etch residue material, by contacting the device with another material, e.g., a pad, or fibrous sorbent applicator element, that has the composition absorbed thereon, by contacting the device including the titanium nitride and/or photoresist etch residue material with a circulating composition, or by any other suitable means, manner or technique, by which the composition is brought into removal contact with the titanium nitride and/or photoresist etch residue material. The application may be in a batch or single wafer apparatus, for dynamic or static cleaning. Advantageously, the compositions described herein, by virtue of their selectivity for titanium nitride and/or photoresist etch residue material relative to other materials that may be present on the microelectronic device structure and exposed to the composition, such as metals and insulating materials (i.e., low-k dielectrics), achieve at least partial removal of the titanium nitride and/or photoresist etch residue material in a highly efficient and highly selective manner.

In use of the compositions of the first or second aspect for removing titanium nitride and/or photoresist etch residue material from microelectronic device structures having same thereon, the composition typically is contacted with the device structure in a single wafer tool for a sufficient time of from about 0.3 minute to about 30 minutes, preferably about 0.5 minutes to about 3 minutes, at temperature in a range of from about 20° C. to about 100° C., preferably about 45° C. to about 60° C. Such contacting times and temperatures are illustrative, and any other suitable time and temperature conditions may be employed that are efficacious to at least partially remove the titanium nitride and/or photoresist etch residue material from the device structure.

In one embodiment, the composition is heated inline during delivery to the device structure. By heating inline, rather than in the bath itself, the composition life increases.

Following the achievement of the desired etching action, the composition can be readily removed from the microelectronic device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

The compositions of the first or second aspect preferably selectively etch titanium nitride material relative to metal conductor and insulating (i.e., low-k dielectric) materials. In one embodiment, the etch rate of titanium nitride is high (upwards of 500 Å $min^{-1}$, preferably upwards of about 350 Å $min^{-1}$ at 50° C. and upwards of about 500 Å $min^{-1}$ at 60° C., while the etch rate of metal is low (about 0.01 to about 10 Å $min^{-1}$, preferably about 0.1 to about 5 Å $min^{-1}$) and the etch rate of low-k dielectric is low (about 0.01 to about 10 Å $min^{-1}$, preferably about 0.01 to about 5 Å $min^{-1}$).

A fifth aspect of the invention relates to the improved microelectronic devices made according to the methods described herein and to products containing such microelectronic devices.

A sixth aspect relates to methods of manufacturing an article comprising a microelectronic device, said method comprising contacting the microelectronic device with a composition for sufficient time to etchingly remove titanium nitride and/or photoresist etch residue material from the surface of the microelectronic device having same thereon, and incorporating said microelectronic device into said article, wherein the composition comprises, consists of or consists essentially of at least one oxidizing agent, at least one etchant, and at least one solvent, wherein the composition is substantially devoid of hydrogen peroxide. Alternatively, the composition comprises, consists of, or consists essentially of at least one oxidizing agent, at least one etchant, at least one metal corrosion inhibitor, at least one oxidizing agent stabilizer, and at least one solvent. In still another alternative, the composition comprises, consists of, or consists essentially of at least one oxidizing agent, at least one etchant, at least one metal corrosion inhibitor, at least one oxidizing agent stabilizer, at least one carboxylate salt, at least one surfactant, and at least one solvent. The composition may further comprise, consist of or consist essentially of titanium nitride material.

A seventh aspect of the invention relates to an article of manufacture comprising, consisting of or consisting essentially of a microelectronic device substrate, a titanium nitride layer on said substrate, and a composition described herein.

The features and advantages of the invention are more fully shown by the illustrative examples discussed below.

Example 1

Three compositions according to the second aspect were prepared as described below in Table 1. Coupons of TiN (type 1), TiN (type 2), copper, silicon oxynitride and ultra low-k dielectric were immersed in each formulation at 50° C. and the etch rate of each determined based on slopes of thickness loss versus time. It can be seen in Table 1 that the selectively of TiN relative to metal (e.g., copper) and dielectric material was at least about 200:1 to about 500:1. In addition, the etch rate of composition C, comprising the carboxylate salt is surprisingly greater than those without the carboxylate salt even though the concentration of oxidizing agent is 40% less than compositions A and B. This is advantageous because of the minimization of the attack on metal conductors such as copper.

TABLE 1

Formulations and etch rates.

| Formulation | A/wt % | B/wt % | C/wt % |
|---|---|---|---|
| deionized water | 72.48 | 72.10 | 73.5 |
| hydrogen peroxide | 27.00 | 27.00 | 15.96 |
| ammonium fluoride | 0.40 | | 0.4 |
| TMAH | | 0.80 | |
| CDTA | | 0.001 | 0.001 |
| sulfanilamide | 0.01 | | |
| 5-methyl-1H-benzotriazole | 0.10 | 0.10 | 0.1 |
| ammonium acetate | | | 10 |
| Novec 4300 | 0.01 | | 0.01 |
| TiN type 1 ER (Å min$^{-1}$) | 240.8 | 263.5 | 294.8 |
| TiN type 2 ER (Å min$^{-1}$) | 153.6 | 175.4 | 210.2 |
| TiN type 2 loss in 4 min (Å) | 614.32 | 701.44 | 840.72 |
| Cu ER (Å min$^{-1}$) | 0.66 | 0.98 | 0.81 |
| SiON ER (Å min$^{-1}$) | 1.07 | 0.03 | 0.59 |
| ULK ER (Å min$^{-1}$) | 0.96 | 0.96 | 1.10 |

Example 2

Seven compositions according to the first aspect (i.e., substantially devoid of hydrogen peroxide) were prepared as described below in Table 2. Coupons of TiN (type 1), copper, PETEOS dielectric, and tungsten were immersed in each formulation at 50° C. or 60° C. and the etch rate was estimated from the loss over a given time interval. It can be seen in Table 2 that the selectivity of TiN relative to Cu and W and to dielectric material is in many cases >50:1, in some cases >100:1. Note that with formulation J, the actual composition had 0.1% HF and 0.1% boric acid, which is expected to convert within minutes to 0.11% HBF$_4$ and 0.023% boric acid (as listed) though the species present eventually at equilibrium may be mainly HBF$_3$OH+HBF$_4$.

TABLE 2

Formulations and Etch Rates

| Formulation | D/wt % (60° C.) | E/wt % (60° C.) | F/wt % (60° C.) | G/wt % (50° C.) | H/wt % (50° C.) | I/wt % (60° C.) | J/wt % (60° C.) |
|---|---|---|---|---|---|---|---|
| deionized water | 99.46 | 99.46 | 99.465 | 99.06 | 99.09 | 99.089 | 98.767 |
| V$_6$O$_{13}$ | 0.01 | 0.01 | | 0.01 | 0.01 | | |
| ammonium iodate | | | 0.005 | | | | |
| Periodic acid | | | | | | 0.01 | |
| Tetrafluoroboric acid | | | | 0.8 | 0.8 | 0.8 | 0.11 |
| Hexafluorosilicic acid | 0.4 | 0.4 | 0.4 | | | | |
| Boric acid | | | | | | | 0.023 |
| 1,4-benzoquinone | | | | | | | 1 |
| 5-phenyl-1H-tetrazole | 0.03 | 0.03 | 0.03 | 0.03 | | | |
| 5-methyl-1H-benzotriazole | | | | | 0.1 | | 0.1 |
| Myristyltrimethyl-ammonium bromide | | | 0.1 | | | | |
| Dodecyltrimethyl-ammonium bromide | | | | 0.1 | | | |
| Benzalkonium chloride | 0.1 | | | | | 0.001 | |
| Benzyldimethyldodecyl ammonium chloride | | 0.1 | | | | | |
| PolyFox PF-159 | | | | | | 0.1 | |
| TiN type 1 ER (from loss in 0.8-1 min) (Å min$^{-1}$) | 146.8 | 97.4 | 139.0 | 111.5 | 106.0 | 183.2 | 93.5 |
| Cu ER (Å min$^{-1}$) (from loss in 30 min) | 6.1 | 2.9 | 1.0 | 1.9 | 2.2 | 10.4 | 0.9 |
| W ER (Å min$^{-1}$) (from loss in 30 min) | 3.8 | 0.9 | 1.1 | 4.4 | 2.3 | 3.0 | — |
| PETEOS ER (Å min$^{-1}$) (from loss in 30 min) | 1.4 | 1.5 | 1.6 | 2.5 | — | 1.1 | 0.4 |

Example 3

Three compositions were formulated as shown in Table 3.

TABLE 3

Compositions with iodine scavengers

| Component | K | L | M |
|---|---|---|---|
| Deionized water | 98.845 | 98.645 | 98.845 |
| $H_2SiF_6$ | 0.8 | 0.8 | 0.8 |
| Ammonium iodate | 0.01 | 0.01 | 0.01 |
| 5-benzyl-tetrazole | 0.04 | 0.04 | 0.04 |
| myristyl trimethyl ammonium Br | 0.005 | 0.005 | 0.005 |
| TEOS | 0.2 | 0.2 | 0.2 |
| 4-methyl-2-pentanone | 0.1 | — | — |
| 2,4-trimethyl-3-pentanone | — | 0.3 | — |
| cyclohexanone | — | — | 0.1 |

Compositions of K, L and M that mimic compositions that have 500 and 750 wafer bath loading were prepared by calculating the mass of Cu (as copper sulfate), TiN (as TiN powder) and W (as ammonium tungstate) that would be dissolved in the solution assuming a certain volume of chemistry and exposure to 500 or 750 wafers. Coupons of Cu, TiN, W, and PETEOS were immersed in clean K, L, and M, as well as 500 wafer loaded K, L, and M solutions, as well as 750 wafer loaded K, L, and M solutions at 60° C. for a specific amount of time. For example, TiN coupons were immersed for 30 seconds, and Cu, W and PETEOS were tested for 5, 15 and 30 minutes. The results are shown in Table 4 below.

TABLE 4

TiN, W, Cu and PETEOS etch rates in formulations K, L, and M.

| Formulation | TiN etch rate/ Å min$^{-1}$ | TiN std dev | W etch rate/ Å min$^{-1}$ | Cu etch rate/ Å min$^{-1}$ | PETEOS etch rate/ Å min$^{-1}$ |
|---|---|---|---|---|---|
| K | 91.3 | 8.9 | <0.5 | 0.6 | <0.5 |
| K (500 wafer loaded) | 85.7 | 8.1 | 0.6 | <0.5 | <0.5 |
| K (750 wafer loaded) | 64.5 | 7.5 | 0.8 | 0.6 | <0.5 |
| L | 92.2 | 7.1 | <0.5 | 0.6 | <0.5 |
| L (500 wafer loaded) | 81.3 | 7.6 | <0.5 | 1.1 | <0.5 |
| L (750 wafer loaded) | 45.3 | 6.2 | 0.6 | 1.0 | <0.5 |
| M | 98.1 | 6.5 | 0.6 | 0.5 | <0.5 |
| M (500 wafer loaded) | 85.4 | 7.1 | 1.0 | 0.7 | <0.5 |
| M (750 wafer loaded) | 44.4 | 1.7 | 1.0 | 0.5 | <0.5 |

It can be seen that all three iodine scavengers tested could extend bath loading life to approximately 500 wafers based on the etch rate testing. At 750 wafer bath loading the limiting factor was TiN etch rate, wherein the most effective iodine scavenger tested was 4-methyl-2-pentanone.

Example 4

Ten concentrated formulations were prepared according to the second aspect described herein, said formulations having the following substituents. Each included 0.01 wt % CDTA and 1.000 wt % 5-methyl BTA, and the etchant described in table 5 below:

TABLE 5

Etchants in formulations AA-JJ.

| Formulation | Etchant | wt % of pure etchant | wt % water |
|---|---|---|---|
| AA | TMAH | 8.000 | 90.990 |
| BB | 40% TEAH | 12.93 | 86.06 |
| CC | 40% TPAH | 17.86 | 81.13 |
| DD | 40% TPAH | 35.71 | 63.28 |
| EE | 55% TBAH | 22.77 | 76.22 |
| FF | KOH | 4.93 | 94.06 |
| GG | 40% TBPH | 24.27 | 74.72 |
| HH | 20% BTEAH | 18.38 | 80.61 |
| II | TMG | 10.11 | 88.88 |
| JJ | 20% DEDMAH | 10.47 | 88.52 |

The concentrated formulations were diluted 9:1 with 30% hydrogen peroxide (9 parts $H_2O_2$ to 1 part concentrate). Coupons of TiN, Cu, Co, TEOS, and LTO (low temperature oxide) were immersed in each diluted formulation at 50° C. and the etch rate of same determined. Most of the TiN (200 Å) was cleared within 1 min process time. The results are tabulated in table 6 below.

TABLE 6

Etch rates of Cu, TiN, LTO, TEOS, and Co in formulations AA-JJ.

| Formulation | Cu ER (Å/min) | TiN ER (Å/min) | LTO ER (Å/min) | TEOS ER (Å/min) | Co ER (Å/min) |
|---|---|---|---|---|---|
| AA | 0.7 | >500 | <0.5 | <0.5 | <0.5 |
| BB | 0.419 | 371.8 | 0.6341 | 0.0216 | −0.2612 |
| CC | 0.237 | 236.5 | 0.1852 | 0.0298 | −0.18 |
| DD | 0.266 | 277.6 | 0.3692 | 0.1996 | −0.203 |
| EE | 0.978 | 180.2 | 0.0474 | −0.111 | 0.457 |
| FF | 0.669 | 418.5 | −0.1559 | 0.38 | 0.69 |
| GG | 0.0157 | 362.2 | 0.0255 | 0.202 | −0.806 |
| HH | 0.552 | 228.9 | 0.1394 | −0.27 | 0.2849 |
| II | 1.184 | 279.7 | 0.2531 | −0.032 | 0.0754 |
| JJ | 0.92 | 233.2 | −0.0188 | 0.0485 | −0.4176 |

It can be seen that advantageously, the formulations comprising different etchants effectively remove TiN without substantially removing the copper, cobalt or low-k dielectric materials.

Example 5

Formulations were prepared according to the first aspect as shown in the table below, whereby amounts are provided in weight percent, based on the total weight of the formulation. The balance of the formulation was deionized water. Coupons of TiN, Cu, W, and LTO (low temperature oxide) were immersed in each diluted formulation at 50° C. and the etch rate of same determined. Notably, the TiN etch rates were not comparable due to different TiN batches and hence different film properties. The results are tabulated in table 7 below.

TABLE 7

Formulations KK-PP and etch results.

| | Form. KK | Form. LL | Form. MM | Form. NN | Form. OO | Form. PP |
|---|---|---|---|---|---|---|
| $H_2SiF_6$ | 0.8 | 0.8 | 0.8 | 0.4 | 0.4 | 0.4 |
| $NH_4IO_3$ | 0.01 | 0.01 | 0.01 | | | |
| periodic acid | | | | 0.125 | 0.125 | 0.125 |
| 5-phenyl tetrazole | | | | 0.003 | 0.003 | 0.003 |
| 5 benzyl tetrazole | 0.04 | 0.04 | 0.04 | | | |
| myristyltrimethylammonium bromide | 0.005 | | | | | |
| hexadecyltrimethyl ammonium p-toluenesulfonate | | 0.005 | | | 0.005 | |
| hexadecyltrimethyl ammonium hydroxide | | | 0.005 | | 0.005 | |
| TEOS | 0.2 | 0.2 | 0.2 | | | 0.005 |
| Cu ER (Å/min) | 1.17 | 0.18 | 0.22 | 7.25 | 0.23 | 10.85 |
| W ER (Å/min) | 0.7 | 1.07 | 2.32 | 0.28 | 161.45 | 0.67 |
| LTO ER (Å/min) | 0.35 | 1.03 | 0.71 | 4.17 | 3.96 | 3.87 |
| TiN ER (Å/min) | 101.41 | 43.22 | 657.04 | 236.16 | 62.98 | 755.82 |

The conclusion from these experiments is that the non-bromide surfactant/corrosion inhibitor was highly effective in the ammonium iodate system, whereby TiN was selectively etched over Cu, W, and LTO.

Example 6

Formulations were prepared according to the first aspect as shown in the table below, whereby amounts are provided in weight percent, based on the total weight of the formulation. The balance of the formulation was deionized water. Coupons of TiN, Cu, W, and PETEOS were immersed in each diluted formulation at 50° C. and the etch rate of same determined. The results are tabulated in table 8 below.

TABLE 8

Formulations RR-VV and etch rates.

| | Form. RR | Form. SS | Form. TT | Form. UU | Form. VV |
|---|---|---|---|---|---|
| fluoride source | 0.8 wt % $H_2SiF_6$ | 0.8 wt % $H_2ZrF_6$ | 0.8 wt % $H_2TiF_6$ | 0.8 wt % $HPF_6$ | 1 wt % HF |
| TEOS | 0.1 | 0.1 | 0.1 | 0.1 | 0.1 |
| 4-methyl-2-pentanone | 0.1 | 0.1 | 0.1 | 0.1 | 0.1 |
| myristyltrimethylammonium bromide | 0.005 | 0.005 | 0.005 | 0.005 | 0.005 |
| methyl BTA | 0.5 | 0.5 | 0.5 | 0.5 | 0.5 |
| ammonium iodate | 0.01 | 0.01 | 0.01 | 0.01 | 0.01 |
| DI water | 98.49 | 98.49 | 98.49 | 98.49 | 98.29 |
| Cu ER (Å/min) | 0.7 | 0.6 | 1.0 | 0.6 | 0.5 |
| W ER (Å/min) | 2.1 | 1.8 | 2.2 | 6.2 | 9.8 |
| TiN ER (Å/min) | 117.1 | 78.6 | 40.5 | 122.8 | 420.9 |
| PETEOS ER (Å/min) | 0.9 | 0.5 | 1.7 | 5.1 | — |

The conclusion from these experiments is that different fluoride sources are effective in the ammonium iodate system, whereby TiN was selectively etched over Cu, W, and LTO. The etch rate seems to be strongly affected by the pH.

Example 7

Formulations were prepared according to the first aspect as shown in the table below, whereby amounts are provided in weight percent, based on the total weight of the formulation. The balance of the formulation was deionized water. Coupons of TiN, Cu, W, TEOS and LTO (low temperature oxide) were immersed in each formulation at 50° C. and the etch rate of same determined, as provided in Table 9.

TABLE 9

Formulations WW-ZZ-2 and etch rates.

| | Form. WW | Form. XX | Form. YY | Form. ZZ | Form. ZZ-1 | Form. ZZ-2 |
|---|---|---|---|---|---|---|
| Fluoride source | 1.2 wt % $H_2SiF_6$ | 1.2 wt % $H_2SiF_6$ | 1.2 wt % $H_2SiF_6$ | 0.8 wt % $H_2SiF_6$ | 0.8 wt % $H_2SiF_6$ | 0.8 wt % $H_2SiF_6$ |
| Ammoniumiodate | | | | 0.01 | 0.01 | 0.01 |
| periodic acid | 0.003 | | | | | |
| V6O13 | | 0.01 | | | | |
| NH4VO3 | | | 0.01 | | | |
| TEOS | 0.3 | 0.3 | 0.3 | 0.2 | 0.2 | 0.2 |
| Benzalkonium chloride | 0.004 | 0.004 | 0.004 | | | 0.005 |
| Myristyltrimethylammonium bromide | | | | 0.005 | 0.005 | |
| 5 Methyl BTA | | | | 0.5 | 0.5 | 0.5 |
| 4-methyl-2-pentanone | | | | | 0.1 | 0.1 |

TABLE 9-continued

Formulations WW-ZZ-2 and etch rates.

| | Form. WW | Form. XX | Form. YY | Form. ZZ | Form. ZZ-1 | Form. ZZ-2 |
|---|---|---|---|---|---|---|
| DI water | 98.49 | 98.49 | 98.49 | 98.49 | 98.39 | 98.39 |
| Cu ER (Å/min) | | | | 0.5 | 1.7 | 1.3 |
| W ER (Å/min) | <0.5 | 0.9 | 0.8 | <0.5 | <2.3 | <0.5 |
| TiN ER (Å/min) | 109.1 | 122.6 | 132.9 | 49.33 | 51.57 | 39.49 |
| LTO ER (Å/min) | 1.3 | 1.1 | 1.0 | 1.4 | <0.5 | <0.5 |
| TEOS ER (Å/min) | <0.5 | <0.5 | <0.5 | <0.5 | <0.5 | <0.5 |

The conclusion from these experiments with different oxidizers and higher fluoride concentration is that a higher TiN etch rate is achieved, and thus higher selectivity towards the other metal conductor layers and dielectric layers.

Example 8

Formulations of the first aspect were prepared that included 0.01 wt % ammonium iodate, 0.8 wt % hexafluorosilicic acid, 0.2 wt % TEOS, 0.04 wt % 5-benzyl tetrazole, the corrosion inhibitor disclosed in Table 10, and the balance water. The pH of each was in a range from 1-3. Etch rate determinations were performed by immersing commercially available TiN and W coupons in each formulation for time at 50° C. and analyzing for TiN and W lost. The results are also provided in Table 10.

TABLE 10

| Formulation | Corrosion inhibitor/wt. % | W ER/Å min$^{-1}$ | TiN ER/Å min$^{-1}$ | TiN/W selectivity |
|---|---|---|---|---|
| A1 | 0.005 wt % myristyl trimethylammonium bromide | 0.70 | 46.63 | 66.9 |
| A1 | 0.005 wt % myristyl trimethylammonium bromide | 0.90 | 45.27 | 50.4 |
| A1 | 0.005 wt % myristyl trimethylammonium bromide | 0.60 | 33.67 | 55.9 |
| A1 | 0.005 wt % myristyl trimethylammonium bromide | 0.79 | 22.76 | 28.9 |
| A2 | 0.005 wt % benzalkonium chloride | 0.84 | 39.67 | 47.0 |
| A3 | 0.0025 wt % hexadecyltrimethylammonium p-toluenesulfonate | 8.35 | 17.93 | 2.1 |
| A4 | 0.01 wt % hexadecyltrimethylammonium p-toluenesulfonate | 1.88 | 19.80 | 10.5 |
| A5 | 0.025 wt % hexadecyltrimethylammonium hydroxide | 5.53 | 19.76 | 3.6 |
| A6 | 0.01 wt % hexadecyltrimethylammonium hydroxide | 0.93 | 33.40 | 35.9 |
| A7 | 0.0025 wt % sodium dodecylbenzenesulfonate | 8.59 | 69.68 | 8.1 |
| A8 | 0.01 wt % sodium dodecylbenzenesulfonate | 22.17 | 27.15 | 1.2 |
| A10 | 0.005 wt % benzalkonium chloride | 0.59 | 33.88 | 57.6 |
| A11 | 0.0025 wt % benzyldodecyldimethyl ammonium chloride | 0.71 | 44.41 | 62.5 |
| A12 | 0.01 wt % benzyldodecyldimethyl ammonium chloride | 0.75 | 31.37 | 41.6 |
| A13 | 0.0025 wt % benzethonium chloride | 0.55 | 24.87 | 44.8 |
| A14 | 0.01 wt % benzethonium chloride | 0.62 | 13.86 | 22.4 |
| A15 | 0.0025 wt % dodecyltrimethylammonium bromide | 0.45 | 51.79 | 114.2 |
| A16 | 0.01 wt % dodecyltrimethylammonium bromide | 0.80 | 45.72 | 56.9 |
| A17 | 0.05 wt % saccharin | 0.84 | 44.21 | 52.8 |
| A18 | 0.125 wt % saccharin | 0.76 | 50.68 | 66.7 |
| A19 | 0.00025 wt % 1-methyl-3-n-octylimidazolium tetrafluoroborate | 0.49 | 30.52 | 62.7 |
| A20 | 0.001 wt % 1-methyl-3-n-octylimidazolium tetrafluoroborate | 0.37 | 27.98 | 76.5 |
| A21 | 0.00025 wt % 1-decyl-3-methylimidazolium tetrafluoroborate | 0.40 | 28.27 | 70.5 |
| A22 | 0.001 wt % 1-decyl-3-methylimidazolium tetrafluoroborate | 0.40 | 30.79 | 77.4 |
| A23 | 0.00025 wt % 1-decyl-3-methylimidazolium chloride | 0.40 | 26.32 | 66.5 |
| A24 | 0.001 wt % 1-decyl-3-methylimidazolium chloride | 0.49 | 28.74 | 58.8 |
| A25 | 0.00025 wt % tridodecylmethyl ammonium bromide | 0.31 | 28.76 | 91.5 |
| A26 | 0.001 wt % tridodecylmethyl ammonium bromide | 0.26 | 30.15 | 115.4 |
| A27 | 0.00025 wt % hexadecyltrimethyl ammonium bromide | 0.35 | 22.64 | 63.9 |
| A28 | 0.001 wt % hexadecyltrimethyl ammonium bromide | 0.51 | 13.89 | 27.2 |
| A29 | 0.00025 wt % dimethyldistearyl ammonium chloride | 0.30 | 19.86 | 66.7 |
| A30 | 0.001 wt % dimethyldistearyl ammonium chloride | 0.51 | 23.77 | 46.4 |
| A31 | 0.00025 wt % hexamethonium chloride | 0.20 | 26.59 | 136.4 |
| A32 | 0.001 wt % hexamethonium chloride | 0.36 | 28.17 | 79.2 |
| A33 | 0.00025 wt % tetraheptylammonium bromide | 0.65 | 21.32 | 32.9 |
| A34 | 0.001 wt % tetraheptylammonium bromide | 0.53 | 23.34 | 44.2 |
| A35 | 0.00025 wt % tetrakisdecylammonium bromide | 0.24 | 27.29 | 113.7 |
| A36 | 0.001 wt % tetrakisdecylammonium bromide | 0.52 | 19.29 | 37.1 |

It can be seen that the inclusion of certain cationic quaternary salts had a substantial impact on the selectivity of the removal of TiN relative to tungsten.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A composition for selectively removing titanium nitride and/or photoresist etch residue material from the surface of a microelectronic device having same thereon, said composition comprising (a) a concentrate comprising at least one etchant, at least one metal corrosion inhibitor, at least one oxidizing agent stabilizer, and at least one solvent, and (b) at least one oxidizing agent, wherein the at least one metal corrosion inhibitor comprises a species selected from the group consisting of 5-methyl-benzotriazole, benzotriazole carboxylic acid, pentylenetetrazole, 5-phenyl-1H-tetrazole, 5-benzyl-1H-tetrazole, oleic imidazoline, 2-benzylpyridine, succinimide, adenosine, carbazole, saccharin, benzoin oxime, poly(ethylene glycol), poly(propylene glycol), PEG-PPG copolymers, myristyltrimethylammonium bromide, hexadecyltrimethylammonium hydroxide, and combinations thereof, and wherein the at least one oxidizing agent stabilizer comprises a species selected from the group consisting of glycine, serine, proline, leucine, alanine, asparagine, aspartic acid, glutamine, valine, and lysine, nitrilotriacetic acid, iminodiacetic acid, ethylenediaminetetraacetic acid (EDTA), (1,2-cyclohexylenedinitrilo)tetraacetic acid (CDTA), uric acid, tetraglyme, diethylenetriamine pentaacetic acid, propylenediamine tetraacetic acid, ethylendiamine disuccinic acid, sulfanilamide, and combinations thereof.

2. The composition of claim 1, wherein the composition comprises about 0.001 wt % to about 50 wt % of at least one oxidizing agent, about 0.01 wt % to about 10 wt % of at least one etchant, about 0.01 wt % to about 1 wt % of at least one metal corrosion inhibitor, about 0.0001 wt % to about 0.5 wt % of at least one oxidizing agent stabilizer, and about 39 wt % to about 99 wt % of at least one solvent.

3. The composition of claim 1, wherein the at least one etchant comprises a species selected from the group consisting of $H_2ZrF_6$, $H_2TiF_6$, $HPF_6$, HF, ammonium fluoride, tetrafluoroboric acid, hexafluorosilicic acid, tetrabutylammonium tetrafluoroborate (TBA-$BF_4$), ammonium hexafluorosilicate, ammonium hexafluorotitanate, tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl) trimethylammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), 1,1,3,3-tetramethylguanidine (TMG), guanidine carbonate, arginine, ammonium hydroxide, monoethanolamine (MEA), diethanolamine (DEA), triethanolamine (TEA), ethylenediamine, cysteine, tetraalkylammonium fluoride ($NR_1R_2R_3R_4F$), and combinations thereof, where $R_1$, $R_2$, $R_3$, $R_4$ may be the same as or different from one another and is selected from the group consisting of straight-chained $C_1$-$C_6$ alkyl groups and branched $C_1$-$C_6$ alkyl groups.

4. The composition of claim 1, wherein the at least one etchant comprises TMAH.

5. The composition of claim 1, wherein the at least one oxidizing agent comprises a species selected from the group consisting of hydrogen peroxide, $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), periodic acid, iodic acid, vanadium (V) oxide, vanadium (IV,V) oxide, ammonium vanadate, ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$), ammonium tungstate (($NH_4)_{10}H_2(W_2O_7)$), sodium persulfate ($Na_2S_2O_8$), sodium hypochlorite (NaClO), sodium perborate, potassium iodate ($KIO_3$), potassium permanganate ($KMnO_4$), potassium persulfate, nitric acid ($HNO_3$), potassium persulfate ($K_2S_2O_8$), potassium hypochlorite (KClO), tetramethylammonium chlorite (($N(CH_3)_4$/$ClO_2$), tetramethylammonium chlorate (($N(CH_3)_4$)$ClO_3$), tetramethylammonium iodate (($N(CH_3)_4$)$IO_3$), tetramethylammonium perborate (($N(CH_3)_4$)$ClO_3$), tetramethylammonium perchlorate (($N(CH_3)_4$/$ClO_4$), tetramethylammonium periodate (($N(CH_3)_4$)$IO_4$), tetramethylammonium persulfate (($N(CH_3)_4$/$S_2O_8$), tetrabutylammonium peroxomonosulfate, peroxomonosulfuric acid, ferric nitrate ($Fe(NO_3)_3$), urea hydrogen peroxide (($CO(NH_2)_2$)$H_2O_2$), peracetic acid ($CH_3(CO)OOH$), 1,4-benzoquinone, toluquinone, dimethyl-1,4-benzoquinone, chloranil, alloxan, N-methylmorpholine N-oxide, trimethylamine N-oxide, and combinations thereof.

6. The composition of claim 1, wherein the at least one oxidizing agent comprises hydrogen peroxide.

7. The composition of claim 1, wherein the at least one solvent comprises water.

8. The composition of claim 1, further comprising at least one carboxylate salt.

9. The composition of claim 8, wherein the at least one carboxylate salt comprises an ammonium cation and an anion selected from the group consisting of acetate, benzoate, citrate, formate, oxalate, tartarate, succinate, lactate, maleate, malonate, fumarate, malate, ascorbate, mandelate, and phthalate.

10. The composition of claim 8, wherein the at least one carboxylate salt comprises ammonium acetate, ammonium benzoate, or a combination thereof.

11. The composition of claim 1, wherein the at least one metal corrosion inhibitor comprises 5-methyl-1H-benzotriazole.

12. The composition of claim 1, wherein the at least one oxidizing agent stabilizer comprises CDTA, sulfanilamide, or a combination thereof.

13. The composition of claim 1, wherein the composition is substantially devoid of silicates, abrasive materials, chloride sources, metal halides, and combinations thereof.

14. The composition of claim 1, wherein pH of the composition is in a range from about 5 to about 10.

15. A method of etching titanium nitride material from a surface of a microelectronic device having same thereon, said method comprising contacting the surface with a composition, wherein the composition selectively removes the titanium nitride material from the surface relative to metals and insulating materials, said composition comprising (a) a concentrate comprising at least one etchant, at least one metal corrosion inhibitor, at least one oxidizing agent stabilizer, and at least one solvent, and (b) at least one oxidizing agent, wherein the at least one metal corrosion inhibitor comprises a species selected from the group consisting of 5-methyl-benzotriazole, benzotriazole carboxylic acid, pentylenetetrazole, 5-phenyl-1H-tetrazole, 5-benzyl-1H-tetrazole, oleic imidazoline, 2-benzylpyridine, succinimide, adenosine, carbazole, saccharin, benzoin oxime, poly(ethylene glycol), poly(propylene glycol), PEG-PPG copolymers, myristyltrimethylammonium bromide, hexadecyltrimethylammonium hydroxide, and combinations thereof, and wherein the at least one oxidizing agent stabilizer comprises a species selected from the group consisting of glycine, serine, proline, leucine, alanine, asparagine, aspartic acid, glutamine, valine, and lysine, nitrilotriacetic acid, iminodiacetic acid, ethylenediaminetetraacetic acid (EDTA), (1,2-cyclohexylenedinitrilo)tetraacetic acid (CDTA), uric acid, tetraglyme, diethylenetriamine pentaacetic acid, propylenediamine tetraacetic acid, ethylendiamine disuccinic acid, sulfanilamide, and combinations thereof.

16. The method of claim 15, wherein the contacting comprises time in a range from about 0.3 minute to about 30 minutes at temperature in a range of from about 20° C. to about 100° C.

17. The method of claim 15, wherein the composition is rinsed from the surface following the desired etching action.

18. The method of claim 15, wherein the at least one metal corrosion inhibitor comprises 5-methyl-1H-benzotriazole.

19. The method of claim 15, wherein the at least one etchant comprises a species selected from the group consisting of $H_2ZrF_6$, $H_2TiF_6$, $HPF_6$, HF, ammonium fluoride, tetrafluoroboric acid, hexafluorosilicic acid, tetrabutylammonium tetrafluoroborate (TBA-$BF_4$), ammonium hexafluorosilicate, ammonium hexafluorotitanate, tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl) trimethylammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), 1,1,3,3-tetramethylguanidine (TMG), guanidine carbonate, arginine, ammonium hydroxide, monoethanolamine (MEA), diethanolamine (DEA), triethanolamine (TEA), ethylenediamine, cysteine, tetraalkylammonium fluoride ($NR_1R_2R_3R_4F$), and combinations thereof, where $R_1$, $R_2$, $R_3$, $R_4$ may be the same as or different from one another and is selected from the group consisting of straight-chained $C_1$-$C_6$ alkyl groups and branched $C_1$-$C_6$ alkyl groups.

20. The method of claim 15, wherein the at least one oxidizing agent comprises a species selected from the group consisting of hydrogen peroxide, $FeCl_3$, $FeF_3$, $Fe(NO_3)_3$, $Sr(NO_3)_2$, $CoF_3$, $MnF_3$, oxone ($2KHSO_5.KHSO_4.K_2SO_4$), periodic acid, iodic acid, vanadium (V) oxide, vanadium (IV,V) oxide, ammonium vanadate, ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$), ammonium tungstate (($NH_4)_{10}H_2(W_2O_7)$), sodium persulfate ($Na_2S_2O_8$), sodium hypochlorite (NaClO), sodium perborate, potassium iodate ($KIO_3$), potassium permanganate ($KMnO_4$), potassium persulfate, nitric acid ($HNO_3$), potassium persulfate ($K_2S_2O_8$), potassium hypochlorite (KClO), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate $4N(CH_3)_4)S_2O_8$), tetrabutylammonium peroxomonosulfate, peroxomonosulfuric acid, ferric nitrate ($Fe(NO_3)_3$), urea hydrogen peroxide (($CO(NH_2)_2)H_2O_2$), peracetic acid ($CH_3(CO)OOH$), 1,4-benzoquinone, toluquinone, dimethyl-1,4-benzoquinone, chloranil, alloxan, N-methylmorpholine N-oxide, trimethylamine N-oxide, and combinations thereof.

* * * * *